(12) United States Patent
Borremans

(10) Patent No.: US 8,294,520 B2
(45) Date of Patent: Oct. 23, 2012

(54) SWITCHABLE MULTIBAND LNA DESIGN

(75) Inventor: Jonathan Borremans, Lier (BE)

(73) Assignees: IMEC, Leuven (BE); Vrije Universiteit Brussel, Brussels (BE)

( * ) Notice: Subject to any disclaimer, the term of this patent is extended or adjusted under 35 U.S.C. 154(b) by 0 days.

(21) Appl. No.: 12/599,966

(22) PCT Filed: May 19, 2008

(86) PCT No.: PCT/EP2008/056122
§ 371 (c)(1),
(2), (4) Date: Nov. 12, 2009

(87) PCT Pub. No.: WO2008/142051
PCT Pub. Date: Nov. 27, 2008

(65) Prior Publication Data
US 2010/0301946 A1   Dec. 2, 2010

Related U.S. Application Data

(60) Provisional application No. 60/930,801, filed on May 18, 2007.

(30) Foreign Application Priority Data

Nov. 6, 2007  (EP) ..................................... 07120083

(51) Int. Cl.
*H03F 1/34*   (2006.01)
(52) U.S. Cl. ........................................ 330/294; 330/311
(58) Field of Classification Search ............ 330/98–100, 330/294, 311, 85, 291
See application file for complete search history.

(56) References Cited

U.S. PATENT DOCUMENTS

| | | | | |
|---|---|---|---|---|
| 5,015,968 A | * | 5/1991 | Podell et al. | 330/294 |
| 6,100,759 A | * | 8/2000 | Sirna et al. | 330/261 |
| 6,204,728 B1 | * | 3/2001 | Hageraats | 330/294 |
| 6,600,371 B2 | * | 7/2003 | Cali | 330/260 |
| 7,164,318 B2 | * | 1/2007 | Costa et al. | 330/311 |
| 7,298,205 B2 | * | 11/2007 | Nakatani et al. | 330/294 |
| 7,489,200 B2 | * | 2/2009 | Chang et al. | 330/291 |

(Continued)

FOREIGN PATENT DOCUMENTS
WO   WO98/54833   12/1998

OTHER PUBLICATIONS

Borremans, J. et al., "A Switchable Low-Area 2.4-and-5 GHz Dual-Band LNA in Digital CMOS", 33rd European Solid State Circuits Conference, Sep. 1, 2007, pp. 376-379.

(Continued)

*Primary Examiner* — Khanh V Nguyen
(74) *Attorney, Agent, or Firm* — McDonnell Boehnen Hulbert & Berghoff LLP

(57) ABSTRACT

A low noise amplifying (LNA) circuit comprising an amplifying section (11, 12) and a feedback means (14) arranged for providing input matching from the output to the input. The LNA circuit further comprises at least one frequency band determining inductor (15) having a predetermined resonance frequency for influencing at least one frequency band in which the amplifying section operates. The at least one inductor is directly connected to the output of the circuit and the feedback means (14) provides a feedback connection for the section (s) to the input. In this way, the at least one frequency band in which the amplifying section operates is substantially completely determined by the at least one frequency band determining inductor (15).

14 Claims, 10 Drawing Sheets

U.S. PATENT DOCUMENTS

| | | |
|---|---|---|
| 2007/0085617 A1 | 4/2007 | Salerno |
| 2007/0139117 A1* | 6/2007 | Iida .............................. 330/277 |
| 2008/0113682 A1* | 5/2008 | Park et al. ................. 455/248.1 |

OTHER PUBLICATIONS

Andersson, S. et al., "Wideband LNA for a Multistandard Wireless Receiver in 0.18 um CMOS", European Solid-State Circuits, 2003, ESSCIRC '03 Conference, Sep. 16, 2003, pp. 655-658.

Mohan, Sunderarajan S. et al., "Bandwidth Extension in CMOS with Optimized On-Chip Inductors", IEEE Journal of Solid-State Circuits, vol. 35, No. 3, Mar. 2000; pp. 346-355.

Guo, Xiaoling et al., "A Power Efficient Differential 20-GHz Low Noise Amplifier with 5.3-GHz 3-dB Bandwidth", IEEE Microwave and Wireless Components Letters, vol. 15, No. 9, Sep. 2005, pp. 603-605.

Cali, Giovanni et al., A High-Performance Si-Bipolar RF Receiver for Digital Satellite Radio, IEEE Transactions on Microwave Theory and Techniques, vol. 46, No. 12, Dec. 1998, pp. 2568-2576.

Malhi, Duljit S. et al., "SiGe W-CDMA Transmitter for Mobile Terminal Application", IEEE Journal of Solid-State Circuits, vol. 38, No. 9, Sep. 2003, pp. 1570-1574.

Li, Wei-Chang et al., "A 2.4-GHz/3.5-GHz/5-GHz Multi-Band LNA With Complementary Switched Capacitor Multi-Tap Inductor in 0.18um CMOS", VLSI Design, Automation and Test, 2006, International Symposium, IEEE, Apr. 1, 2006, pp. 1-4.

Martins, Miguel et al., "Techniques for Dual-Band LNA Design Using Cascode Switching and Inductor Magnetic Coupling", Circuits and Systems, 2007, ISCAS 2007, IEEE International Symposium, IEEE, May 1, 2007, pp. 1449-1452.

International Search Report, International Application No. PCT/EP2008/056122 dated Jan. 16, 2009.

Hashemi, Hossein et al., "Concurrent Multiband Low-Noise Amplifiers-Theory, Design, and Applications", IEEE Transactions on Microwave Theory and Techniques, vol. 50, No. 1, Jan. 2002, pp. 288-301.

Bagheri, Rahim et al., An 800-MHz-6-GHz Software-Defined Wireless Receiver in 90-nm CMOS, IEEE Journal of Solid-State Circuits, vol. 41, No. 12, Dec. 12, 2006, pp. 2860-2876.

* cited by examiner

SWITCHABLE MULTIBAND LNA DESIGN

CROSS REFERENCE TO RELATED APPLICATIONS

The present application claims priority to U.S. Provisional Application 60/930,801, filed May 18, 2007 and European Patent Application EP07120083.6, filed in the European Patent Office on Nov. 6, 2007, the entire contents of both of which are incorporated herein by reference.

TECHNICAL FIELD

The present invention relates to a low area LNA technique applicable for switched multiband LNA design, particular in digital CMOS.

BACKGROUND ART

Nowadays, multistandard and software-defined radios are emerging, encouraged by the RF capabilities of scaled CMOS and ultimately striving for cognitive radios. Meanwhile, the mask costs of scaled CMOS rise to dramatic heights. In a search for ways to repay this increased cost, low area RF design in digital CMOS has become a hot research topic.

Broadband amplifiers are commonly used as a low area solution for the integration of LNAs for multistandard receivers, as in R. Bagheri et al., "An 800-MHz-6-GHz Software-Defined Wireless Receiver in 90-nm CMOS", *IEEE JSSC*, Vol. 41, No. 12, pp. 2860-2876, December 2006. In scaled CMOS technologies, inductor-less designs attain bandwidths above 6 GHz. Their broadband nature however, imposes high linearity demands on both the LNA and at system level. Alternatively, separate narrowband LNAs relax linearity concerns significantly. While this solution allows optimized performance in each band, the area consumption forms a serious drawback. Multiband LNAs (e.g. H. Hashemi, A. Hajimiri, "Concurrent multiband low-noise amplifiers—theory, design and applications", *IEEE Trans. On Microwave Theory and Techniques*, Vol. 50, No. 1, Part 2, pp. 288-301, January 2002) offer a compromise between wideband and multiple separate LNAs. Often however, these solutions are limited to two bands, and still bear a relatively large area penalty for a reduced performance.

A broadband LNA circuit is disclosed by Andersson, S. et al. in "Wideband LNA for a Multistandard Wireless Receiver in 0.18 μm CMOS", European Solid-state Circuits, Piscataway, N.J., USA, IEEE, 16 Sep. 2003, pp. 655-658. The circuit comprises an inductor as part of the load. The frequency band in which the amplifier operates is however determined by an inductor at the input.

DISCLOSURE OF THE INVENTION

It is an aim of the present invention is to provide a low noise amplifier which consumes less design area.

This aim is achieved with the low noise amplifying circuit comprising all the technical characteristics of the first claim.

According to the invention, a low noise amplifying circuit is presented. The circuit comprises a feedback amplifier which comprises an amplifying section, preferably a low-noise amplifying section, for amplifying signals between the input and the output of the circuit. In particular, the amplifying section comprises an input transistor and an output or cascade transistor. The feedback amplifier is provided with a feedback means arranged for providing input matching from the output to the input. The LNA circuit further comprises at least one frequency band determining inductive section, i.e. a circuit part having a predetermined resonance frequency for influencing at least one frequency band in which the amplifying section operates. According to the invention, the/each frequency band determining inductive section is directly connected to the output of the circuit and the feedback means provides a feedback connection for the section(s) to the input. In this way, the at least one frequency band in which the amplifying section operates is substantially completely determined by the at least one frequency band determining inductive section.

As used herein, with "substantially completely determined" is intended to mean that the/each frequency band determining inductive section is the circuit part which in operation mainly determinates the frequency band in which signals are amplified, i.e. that the influence of any other components active in the circuit on the respective frequency band is neglectable.

As used herein, with "inductive section" is intended to mean a circuit part comprising one or more inductive components and possibly one or more capacitive or resistive components.

In the circuit of the invention, thanks to the feedback means of the amplifier, the output behavior is fed back to the input. This active feedback ensures input matching maintaining a low noise figure (NF). According to the invention, this feedback is exploited and made narrowband by adding at least one inductive section with a predetermined resonance frequency to its load (narrowband gain and thus filtering). The output of the amplifier is a noise-insensitive node, so low area, low-Q inductors can be selected to be placed here. Low area, low-Q inductors in a digital back-end of line can now replace high-Q, large area, thick metal demanding inductors typically used in the prior art designs. This is possible since the inductive section(s) determining the frequency band(s) is/are maintained at noise-insensitive nodes.

In preferred embodiments, the/each inductive section comprises an inductor, preferably a stacked multilayer inductor. These inductors can achieve very high inductance values at very low area, for a low Q. Resonance frequencies above 10 GHz are attainable. Moreover, the inductor can be co-designed with the circuit to choose the Q as a function of the desired load. Very appealing is that this type of inductor can be realized in any digital back-end-of-line (BEOL) with a sufficient number of layers. No RF BEOL is needed, as the inductor is pushed to a location in the circuit where it is rather uncritical for noise. This would be unthinkable for inductive degeneration-type LNAs, where the inductors at the input would have devastating effects on the noise figure, if they would be implemented as stacked inductors. Note that this circuit solution is an example of technology and circuit co-design, exploring solutions to exploit technology for low-area design.

In an embodiment, the feedback means comprises a feedback transistor. In another embodiment, the feedback transistor comprises a transistor in series with one or more feedback resistors. This design can minimize the nonlinearities generated by the feedback transistor. Any other feedback means known to the person skilled in the art may also be used.

In an embodiment, the circuit comprises a plurality of different inductive sections with different resonance frequencies, which are switchably connected to the output (meaning that the direct connection to the output is switchable), hence providing a switchable multiband low noise amplifying circuit. Depending on the desired frequency band, an inductor with its predetermined resonance frequency can be selected and can be switchably connected to the output. Additionally, all switching is preferably performed at noise-insensitive nodes.

In embodiments according to the invention, the input and output transistor forming the amplifying section preferably together form a cascode amplifier. However, any other low noise amplifier topology known to the person skilled in the art may also be used, e.g. two cascaded common source transistors.

In an alternative embodiment, the low noise amplifying circuit comprises a plurality of sections, each forming a separate feedback amplifier as described above with the input transistor in common. Each section has its own inductive section, connected at the respective output. The inductive sections of the different amplifier sections preferably have different resonance frequencies determining the frequency bands in which the circuit is operable. Each inductive section preferably comprises a low-area, low-Q inductor placed at a noise-insensitive node. Each section operates in a predetermined narrowband. A plurality of these sections is switchably connected to the first input transistor, which is common for the sections, providing a switchable concurrent multiband low noise amplifying circuit. For example, switching on two sections can provide a dual-band LNA constructed with miniature size LNA sections. As the area of each section can be very low, adding more bands by adding sections can go relatively unpunished as compared to other LNA solutions.

In an embodiment, one or more of the amplifier sections is controlled by one or more varactors providing a wide frequency tuning range. Even for a limited varactor tuning range, a wide band can be covered and the circuit can benefit from inherent filtering as opposed to a wideband solution.

The invention further relates to a multimode receiver comprising a low noise amplifying circuit as proposed above.

BRIEF DESCRIPTION OF THE DRAWINGS

The invention will be further elucidated by means of the following description and the appended figures.

MODES FOR CARRYING OUT THE INVENTION

Figure 1:
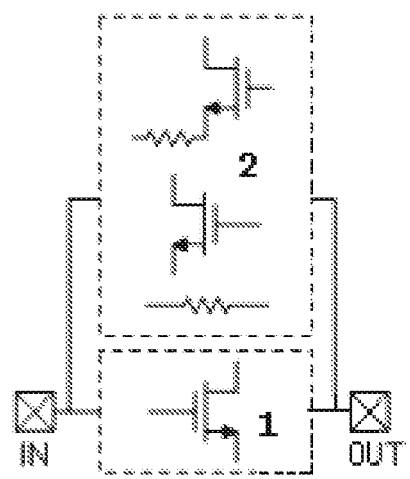
FIG. 1 represents possible feedback topologies.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

FIG. 1 shows a design comprising an amplifier (1) and a feedback amplifier (2). This design is known in the state of art as a shunt-shunt amplifier. It is known in the state of art that a shunt-shunt feedback amplifier employs feedback to obtain adequate input matching for a low noise figure (NF). Active feedback ensures input matching maintaining a low NF. It can be made narrow-band by adding an inductor $L_{LOAD}$ to its load.

Figure 2:
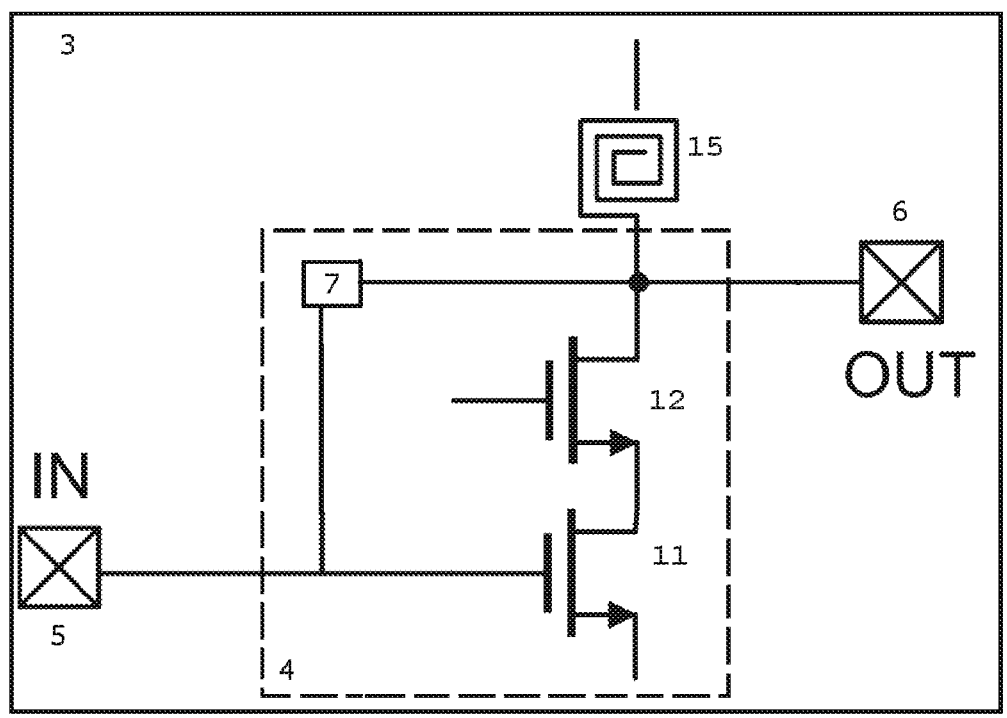
FIG. 2 represents a proposed LNA circuit according to the invention.

A design according to the invention is shown in FIG. 2: a low noise amplifying circuit (3) comprising a feedback amplifier (4) and an inductive section with inductor (15). The feedback amplifier (4) comprises an input transistor (11) and an output transistor (12) forming an LNA between an input (5) and an output (6) of the circuit. The feedback amplifier further comprises a feedback means (7), providing input matching. The inductor (15) is connected to the output (6) of the feedback amplifier (4) and to the input (5) via said feedback means (7). The inductor has a predetermined resonance frequency, chosen such that it determines the frequency band in which the LNA operates. According to the invention, preferably all inductive components determining frequency bands in which the LNA operates are connected at the output side, i.e. the noise insensitive node.

Figure 3:
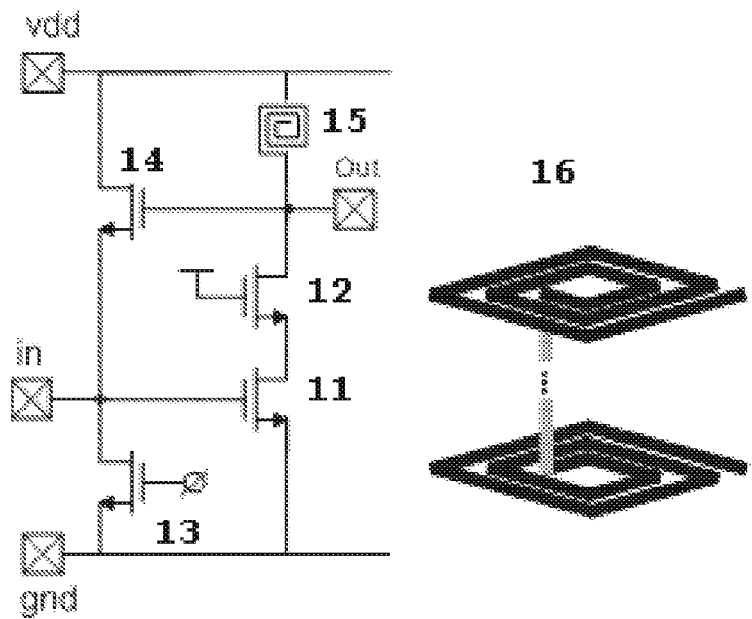
FIG. 3 represents a proposed feedback LNA circuit according to the invention with a stacked inductor load.

A more detailed design is shown in FIG. 3. A low noise amplifier, comprising an input (11) and a cascode transistor (12) and a bias current source (or source follower) (13), is connected to a feedback transistor (14). At the output of the LNA, an inductor $L_{LOAD}$ (15) is placed. This inductor, resonating with the total load capacitance $C_{LOAD}$, also relaxes voltage headroom problems present in the circuit, as no voltage drop over a resistive load is needed. The load inductor is preferably a stacked multilayer inductor (16). The stacked inductor uses several planar windings in several consecutive metal layers.

Below, it is assumed that the resonance frequency of the output load is located sufficiently before the frequency of the input pole. Input matching is achieved when $$g_{mMn2} = \frac{1}{R_S \cdot (1 + A_v)}, \tag{1}$$

where $R_s$ is the source impedance and $A_v = g_{m,Mn1} \cdot R_{LOAD}$ is the circuit's voltage gain at the operating frequency $f_0$ $$f_0 = \frac{1}{\sqrt{L_{LOAD} \cdot C_{LOAD}}}, \quad (2)$$

which is the frequency where $L_{LOAD}$ resonates with $C_{LOAD}$, the total load capacitance at the output.

At $f_0$, the noise factor F is approximately given by:

$$F \approx 1 + \frac{\gamma_1}{g_{mMn1} \cdot R_S} + \frac{\gamma_2}{1 + g_{mMn1} \cdot R_{LOAD}} + \frac{1}{g_{mMn1}^2 \cdot R_{LOAD} \cdot R_S} + \frac{R_S}{R_{Bias}} \quad (3)$$

in which $\gamma_1$ and $\gamma_2$ are the noise excess factors. From equation (3) we see that a large $g_{mMn1}$ is needed to lower the noise. Clearly, the contribution of the inductor—the fourth term in (3)—is suppressed when this large input transconductance is present. The $g_{mMn1}$ has a higher relative impact than the lowered $R_{LOAD}$ caused by the use of a low-Q inductor.

The loop gain upon matching, before, at and after resonance is respectively given by:

$$T_{before.f_0} = \frac{A_v}{2\frac{R_{LOAD}}{sL} + (2 + A_v)} \quad (4)$$

$$T_{at.f_0} = \frac{A_v}{2 + A_v} \quad (5)$$

$$T_{after.f_0} = \frac{A_v}{2 \cdot s \cdot C_{LOAD} \cdot R_{LOAD} + (2 + A_v)} \quad (6)$$

From a brief inspection of these formulas, we conclude that the loop gain magnitude never exceeds 1. Following the Bode criterion, this implies that the amplifier is never unstable under matching conditions. Furthermore, this conclusion holds when also the poles at the input and higher-order poles are considered.

As the amplifier employs feedback, it is prone to the linearity issues of those amplifiers. The linearity of the LNA is mainly determined by the nonlinearity of the active feedback. Indeed, the IIP3 of the wideband LNA without the inductor would be approximately:

$$IIP3 \approx \frac{4}{1 + A_v} \sqrt{\frac{2}{3\left[\left(\frac{K_{2gmMn2}}{g_{mMn2}}\right)^2 + \frac{K_{3gmMn2}}{g_{mMn2}}\right]}} \quad (7)$$

where $K_{2gmMn2}$ and $K_{3gmMn2}$ are the slope and the curvature of $g_{mMn2}$ as a function of $v_{GS}$. The nonlinearity generation by the second-order nonlinearity on $g_{mMn2}$ ($=K_{2gmMn2}$) can be understood as follows. $K_{2gmMn2}$ generates most of the second-order distortion at the input of the circuit, since the signal at the gate of $M_{n2}$ is large (this is the output of the circuit). This distortion propagates linearly to the output, where the second-order nonlinearity $K_{2gmMn2}$ combines it in turn with the fundamental of the output signal to generate third-order distortion at the input. Finally, this third-order distortion propagates linearly to the output. Because of the filtering of the output inductor, however, the second-order distortion generated by $M_{n2}$ reaches the output heavily suppressed, and is hindered to generate third-order distortion. Third-order distortion generated by $K_{3gmMn2}$, however, is not suppressed by this filtering.

Thanks to the lower contribution of $K_{2gmMn2}$, the linearity of the feedback LNA is improved as compared to the wideband (unfiltered) version.

By observation of (7), we can improve the linearity by lowering $A_v$. This is in line with the low-Q inductor, and its impact on the noise can be easily counteracted by increasing $g_{mMn1}$, given the squared relation in the fourth term of (3). Complimentarily, we can increase the overdrive of $M_{n2}$ to decrease the value of both $K_{2gmMn2}$ and $K_{3gmMn2}$. Thanks to the presence of the inductor, sufficient voltage headroom is also available for both $M_{n1}$ and $M_{n2}$ to ensure reasonable linearity. A further increase in linearity can be achieved using a feedback resistor in series with $M_{n2}$ to mitigate the nonlinearity generation by $M_{n2}$, but with a penalty in power consumption, since more $g_{m2}$ is required.

The circuit has been implemented in a 0.13 µm CMOS technology, using a low power supply of 1 V. Note that the proposed technique may be implemented in any of the technologies known to the person skilled in the art, even in e.g. BiCMOS.

A sufficiently high value for $g_{mMn1}$ has been chosen for a reasonably low noise figure, while input matching is preserved by $g_{mMn2}$. A relatively high overdrive for $M_{n1}$ keeps the input pole at high frequencies since it lowers $C_{gs}$ of $M_{n1}$ for a given value of $g_{mMn1}$.

Figure 4:
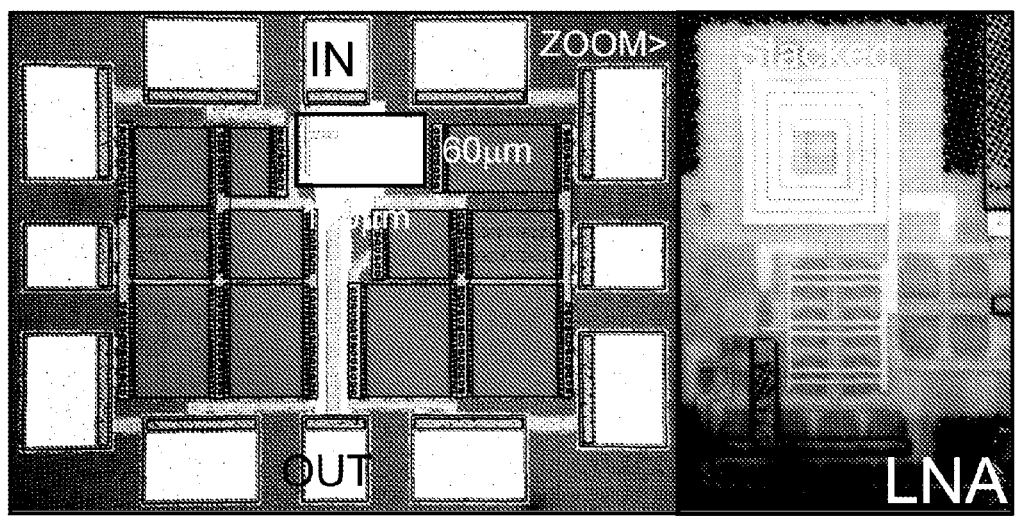
FIG. 4 shows a chip micrograph of a proposed LNA design according to the invention.

The load inductor (15) is a stacked inductor with $L_{LOAD}$=9.5 nH, resonating with the output parasitics. A quality factor of 3.5 is obtained, which yields a parasitic resistance $R_{LOAD}$ of about 700Ω. For the inductor 4.5 windings over 4 layers (M3-M6) are used. The inductor occupies an area of only 40×40 µm². A source follower (13) is employed to drive the 50Ω load of the measurement equipment. FIG. 4 shows a chip micrograph on the left, indicating the very small area consumption (the size of a bondpad) of the complete LNA. On the right side of FIG. 4, a zoom of the LNA is depict, showing the stacked inductor along with the LAN core and buffer.

While the circuit has been implemented in an RF technology, only digital compatible options are used, except MiM-capacitors for supply decoupling.

Figure 5:
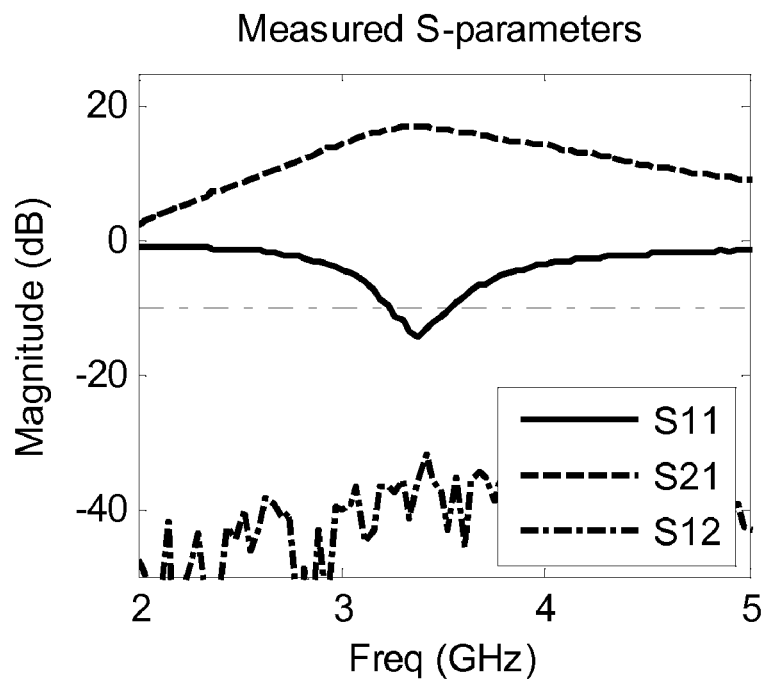
FIG. 5 shows a plot of the S-parameters of a proposed LNA according to the invention.
Figure 6:
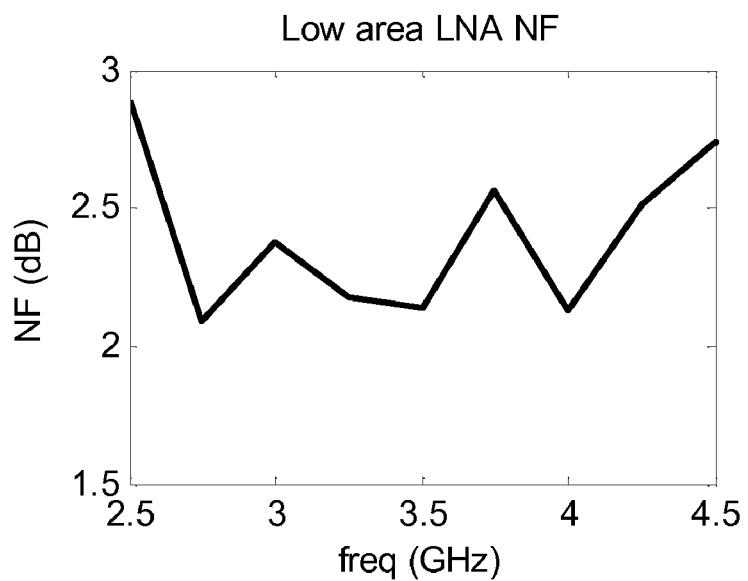
FIG. 6 shows a plot of the measured noise figure of a proposed LNA according to the invention.

FIG. 5 and FIG. 6 show the measured S-parameters and NF. For 3.8 mW, a voltage gain of 20.8 dB is achieved with a 2.2 dB NF and a return loss below −10 dB around 3.4 GHz. The power gain $S_{21}$ is 16.8 dB, including the source follower buffer driving the 50Ω for measurement purposes, adding a loss of about 4 dB. In an actual system, the LNA would drive a mixer, and the buffer would not be needed. The voltage gain is thus about 20.8 dB. The buffer consumes an additional 3.5 mW.

Figure 7:
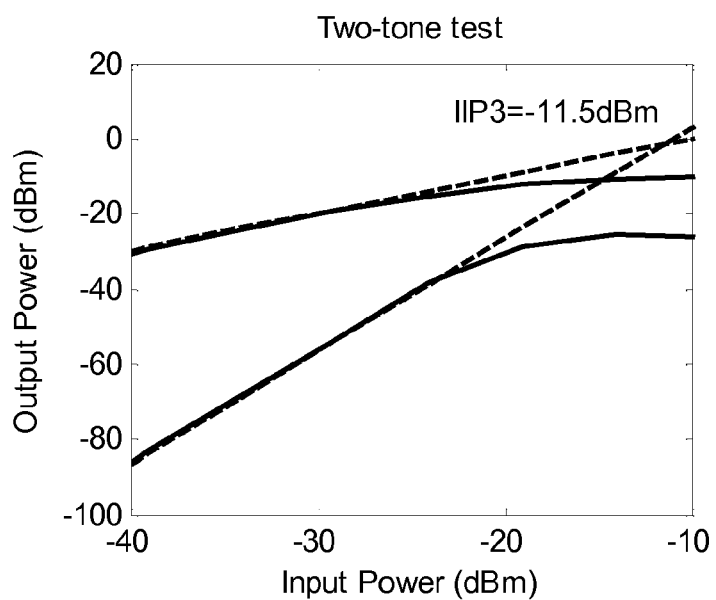
FIG. 7 shows a plot of the output power of a two-tone test measurement.
Figure 8:
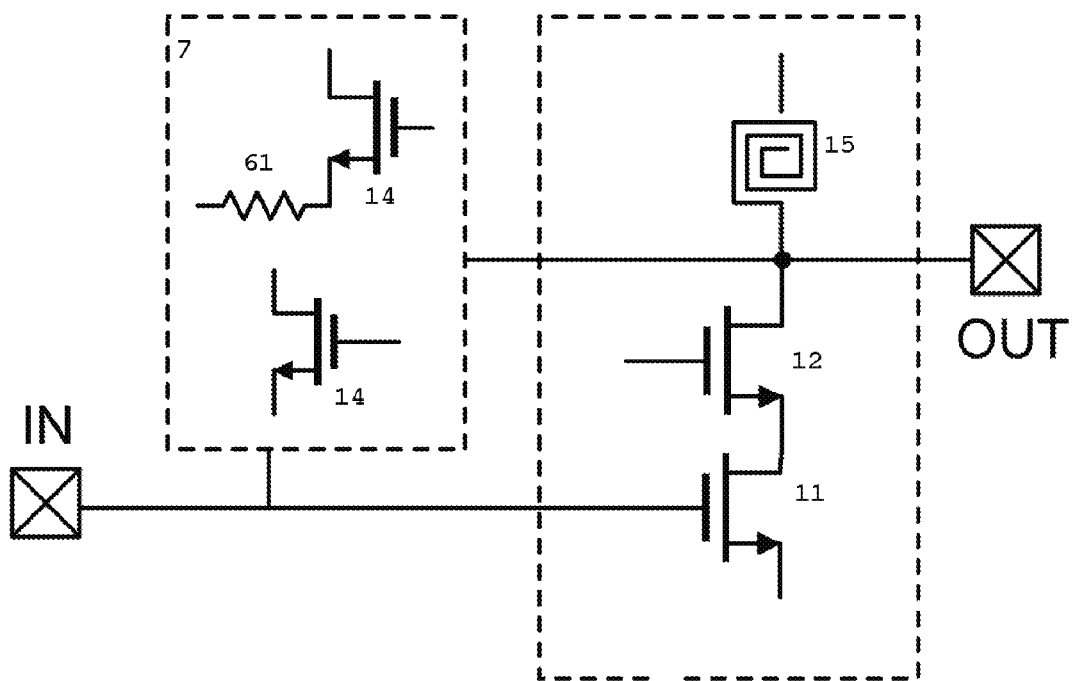
FIG. 8 represents another proposed low area LNA circuit according to the invention.

FIG. 7 shows the two-tone test measurement results for a 3.45 GHz and 3.4 GHz excitation. The measured IIP3 is −11.5 dBm. Note that, if necessary, linearity can be increased as explained in the above sections. The LNA design with a feedback resistor (61) is shown in FIG. 8.

Table 1 lists some recently published fully integrated narrowband LNA designs. The design of the invention offers the best NF for a high gain, and the lowest area consumption while not using the most advanced technology. This LNA is by far the smallest published narrowband LNA in CMOS.

Figure 9:
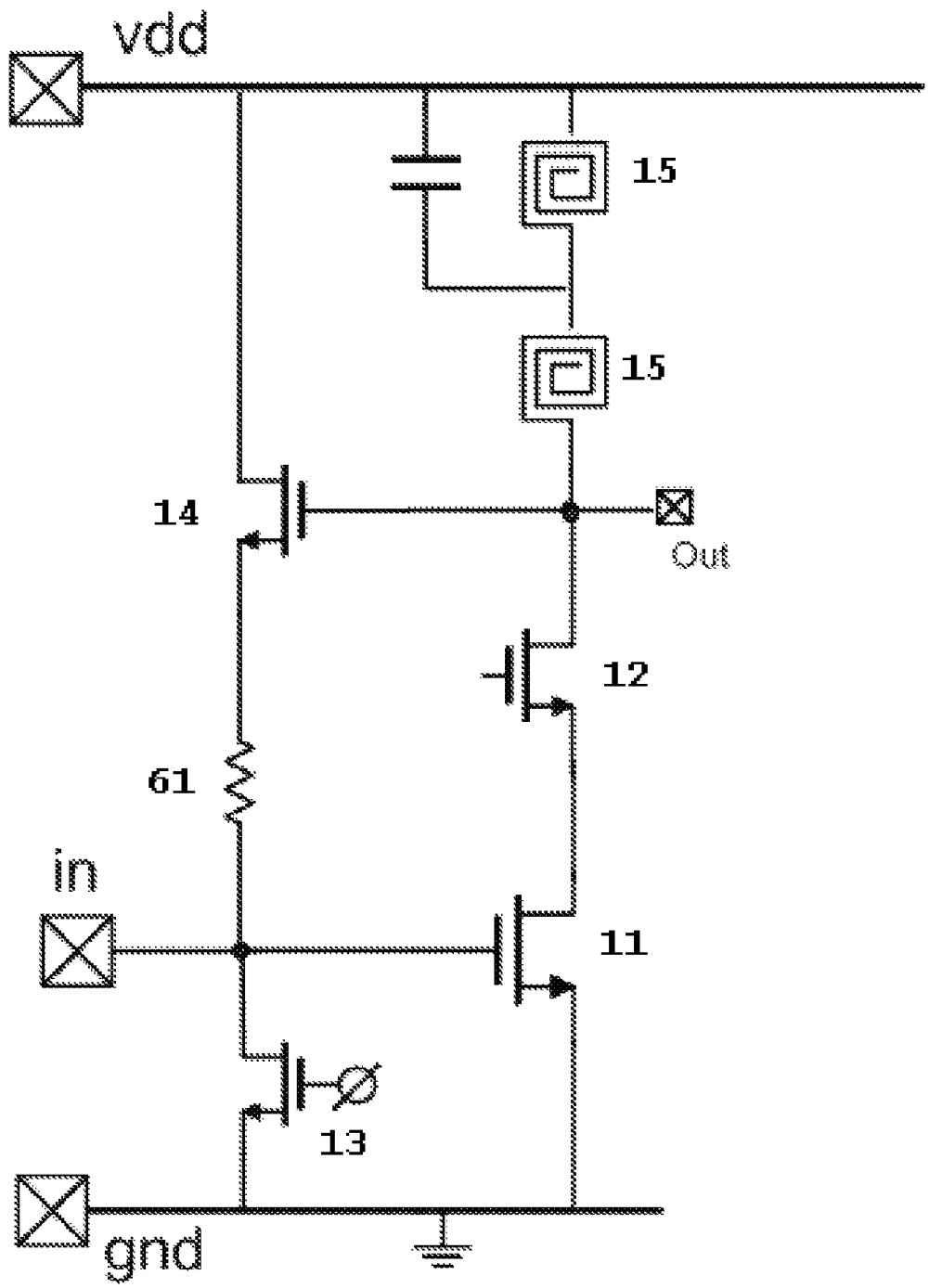
FIG. 9 represents a concurrent dual-band LNA design according to the invention.

A circuit implementation example wherein a high order load is employed for concurrent dual band operation is shown in FIG. 9. In this example a feedback means is used comprising a transistor in series with a resistor (61). Narrowband gain and input matching is achieved concurrently at two frequencies.

TABLE I

RECENTLY PUBLISHED FULLY INTEGRATED NARROWBAND CMOS LNAs

|  | This work | RFIC 06 [Blaakmeer] | JSSC 05 p. 1434 | VLSI 04 p. 372 | RFIC 06 [Lee] | ISSCC 05 p. 534 | ESSCIRC 06 p. 352 | El. Lett. 05 [Wang] p. 66 |
|---|---|---|---|---|---|---|---|---|
| Technology | 0.13 µm CMOS | 90 nm CMOS | 90 nm CMOS | 90 nm CMOS | 0.13 µm CMOS | 0.18 µm CMOS | 0.18 µm CMOS | 0.18 µm CMOS |
| $f_0$ (GHz) | 3.4 | 3.25 | 5.5 | 5.5 | 3 | 5.8 | 1 | 5.7 |
| $NF_{min}$ (dB) | 2.2 | 4.3 | 2.7 | 2.7 | 4.7 | 2.5 | 3.9 | 3.5 |
| Power (mW) | 3.8 (+3.5*) | 8 (+8*) | 9.72 | 20.6 | 0.4 | 3.4 | 0.1 | 3.2 |
| Gain (dB) | 20.8** | 19** | 12.3 | 15.4 | 9.1 | 9.4 | 16.8** | 16.4 |
| IIP3 | −11.5 | −8 | −3 | −6.6 | −11 | 7.6 | −11.2 | — |
| Approx. area | 0.006 | 0.2 | ~0.54 | ~0.44 | ~1.7 | ~0.14 | ~0.18 | ~0.48 |

*power consumption of the buffer,
**voltage gain (other values are power gain)

Figure 10:
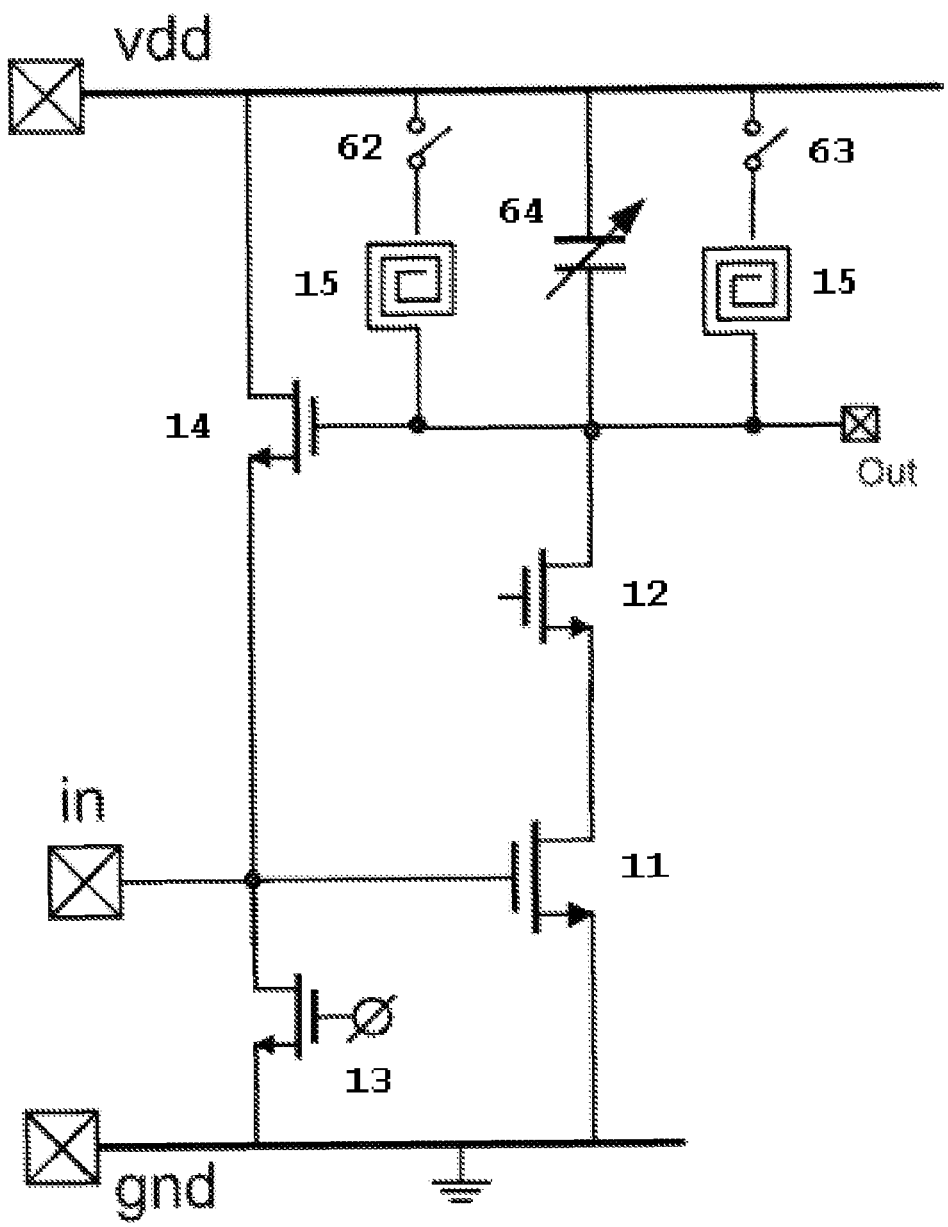
FIG. 10 represents a circuit implementation example according to the invention wherein a varactor is used.

The proposed multiband LNA is derived from the narrowband 'bondpad size' shunt-shunt feedback amplifier. As these LNA implementations occupy a very low area, employing several versions for the different frequency bands on one chip would go relatively unpunished. Since the demands on the Q-factor of the output load are low, varactor tuning can provide additional band selection. FIG. 10 shows a circuit implementation example wherein a varactor (64) is used. In particular, a switched output load is employed in combination with a varactor for additional tuning. Switches (62,63) control the output load. Alternative to the use of several versions, one can integrate them together.

In the embodiment shown in FIG. 10, the switches (62, 63) are placed between the inductors (15) and the Vdd line. Alternatively, they may also be placed between the inductors (15) and the output (Out). In both alternatives, the inductors are understood to be switchably connected to the output, as their influence can be selectively removed from the circuit.

When integrating several amplifier sections together, the input transistor, $M_{n1}$ (11), can be kept common for all amplifiers, since the design trade-offs for this transistor are identical at all frequencies. Indeed, assuming that the input pole frequency lies above the resonance frequency $f_0$, input matching is achieved at resonance when $$g_{mMn2} = \frac{1}{R_S \cdot (1 + A_v)} \quad (8)$$

where $R_s$ is the source impedance and $A_v$ is the amplifier's voltage gain at $f_0$. Since the $g_m$ of $M_{n1}$ (11) is constant for all bands, adequate matching can be ensured by choosing $A_v$ and $g_{m,Mn2}$ properly for each band. The NF at resonance is approximately given by $$F \approx 1 + \frac{\gamma_1}{g_{mMn1} \cdot R_S} + \frac{\gamma_2}{1 + g_{mMn1} \cdot R_{LOAD}} + \frac{1}{g_{mMn1}^2 \cdot R_{LOAD} \cdot R_S} + \frac{R_S}{R_{Bias}} \quad (9)$$

in which $\gamma_1$ and $\gamma_2$ are the noise excess factors of $M_{n1}$ (11) and $M_{n2}$ (14) respectively. From this expression we note that a large $g_{mMn1}$ is required to lower the noise, independent of the frequency. This significantly differs from an inductive degenerated LNA, where the NF is proportional to $(f_0/f_T)^2$, where $f_T$ is the cut-off frequency of the amplifying device [4]. Unavoidably, this dependency results in a higher NF at the high frequency mode, using a common amplifier device.

Figure 11:
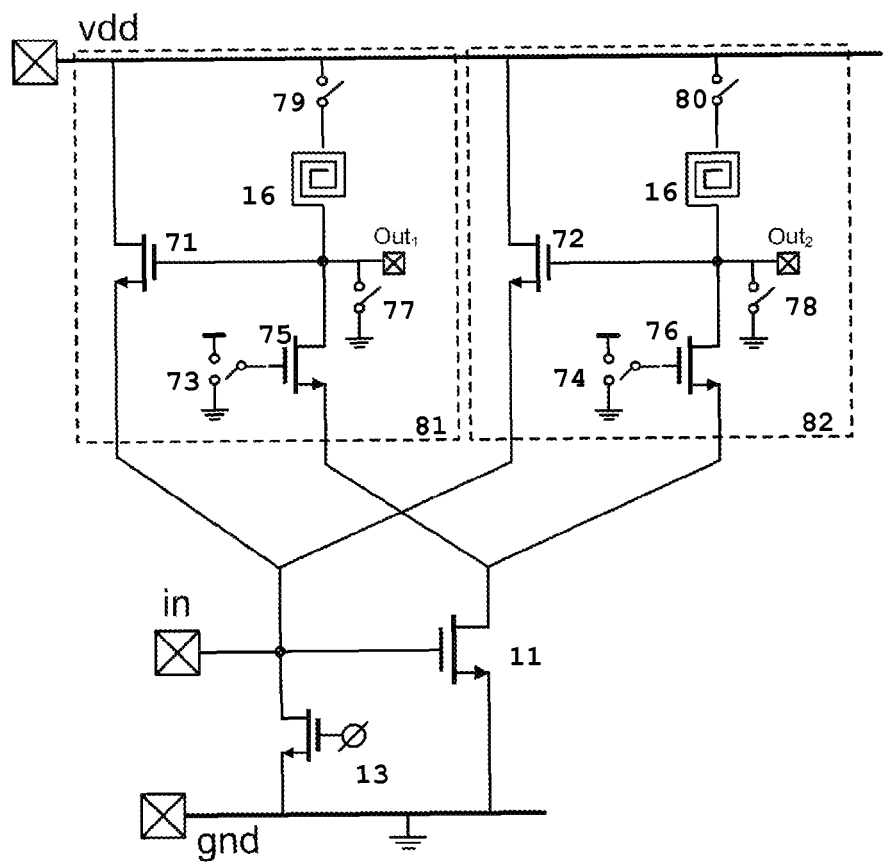
FIG. 11 represents a proposed dual-band LNA design according to the invention.

From these observations, it is clear that the trade-offs for $M_{n1}$ (11) in each band are identical, allowing a single input transistor. The resonating load however, is separate for all desired frequency bands, and can be constructed by different low area stacked inductor sections. Each path has its own feedback transistor $M_{n2i}$ (71,72). As these transistors are small compared to the input transistor $M_{n1}$ (11), they add little capacitance to the input. Therefore, the input pole can be kept at a sufficiently high frequency. Hence, conceptually, a large number of sections could be added to achieve the required frequency bands in a multimode receiver. A dual-band LNA using 2 narrow-band shunt-shunt feedback sections (81,82) is shown in FIG. 11. The miniature size of these sections limits the area penalty of this approach, as compared to traditional LNAs where multiple bulky, high-Q inductors are needed per section. Several sections combined with varactor tuning, can cover a wide band, even for limited varactor tuning range, and benefiting inherent filtering as opposed to a wideband solution.

Figure 12:
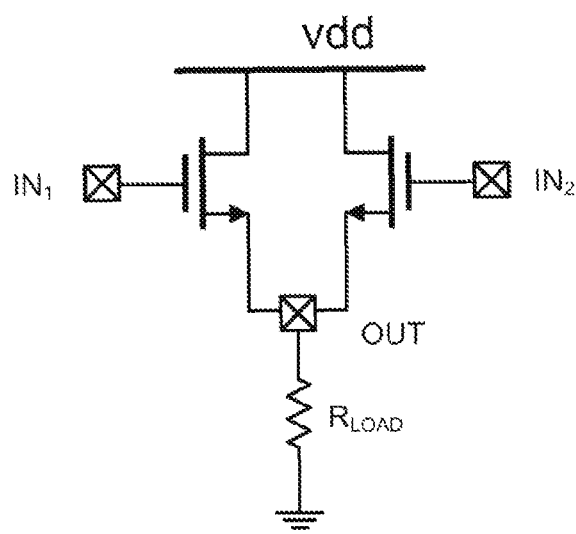
FIG. 12 represents a source follower buffer.

Several switches control which section is active. Together, the switches make each of the sections switchably connectable to the common input transistor $M_{n1}$ (11). Switch $SW_2$ (73,74) controls the ON/OFF state of the cascode transistor $M_{nC}$ (75,76) enabling or disabling current flow. In our implementation, we combine both output signals using a simple source follower buffer, as shown in FIG. 12, for measurement purposes. This buffer drives the 50Ω measurement setup. To switch one of these devices off, a switch $SW_1$ (77,78) sets the LNA output to a clean ground. As a consequence, also $M_{n2}$ (71,72) of the OFF section ($M_{n2,OFF}$) is turned off, and does no longer influence the input matching. Bringing the output node to a low voltage sets $M_{n2,OFF}$ in accumulation, yielding zero intrinsic parasitic feedback via $C_{gs}$ and a $C_{gb}$ of $C_{ox}$ [5]. The third switch $SW_3$ (79,80) has as only purpose to avoid a DC loss current flowing through $L_{LOAD}$ in off-mode. As $SW_3$ (79,80) is located at an AC ground position, in series with the low-Q inductor it can be sized not influencing RF performance at all. If necessary, a bypass capacitor can provide extra decoupling on the node. In alternative embodiments, switches in alternative configurations in the sections may be used to make the sections switchably connectable to the common input transistor. Furthermore, multiple switchable inductive components may also be used in each of the sections, i.e. combining the designs of FIGS. 10 and 11.

Clearly in the design of FIG. 11, no switch is present at a noise sensitive node. The design is thus in line with the philosophy presented in the introduction: use no high-Q inductors, but only low-Q inductors and switches at noise-insensitive nodes. Therefore, low area tunable circuit design is enabled.

Figure 13:
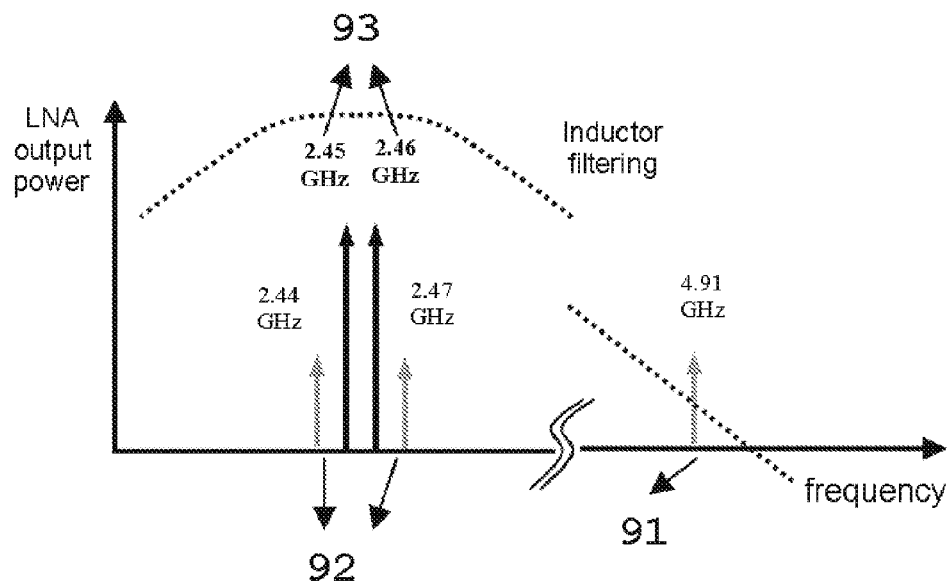
FIG. 13 plots the LNA output power as a function of the frequency for a two-tone experiment.

In this LNA, a fraction of the nonlinearity is due to the feedback. The $2^{nd}$ order spurs at the output combine with the fundamental tones to generate $3^{rd}$ order distortion via $M_{n2}$ (71,72). Therefore, the large voltage gain of the circuit potentially yields nonlinearity. However, the inductive filtering at the output attenuates the $2^{nd}$ order spurs (they are out of band), limiting these $2^{nd}$ order spurs, and consequently also the $3^{rd}$ order nonlinearity. Linearity can be further improved using a feedback resistor (linearizing the feedback), or by lowering the gain. FIG. 13 represents these effects for a two-tone (2.45 GHz and 2.46 GHz (93)) experiment. The $2^{nd}$ order spur (4.91 GHz (91)) is attenuated due to inductor filtering, the $3^{rd}$ order distortion (2.44 GHz and 2.47 GHz (92)) is limited.

Figure 14:
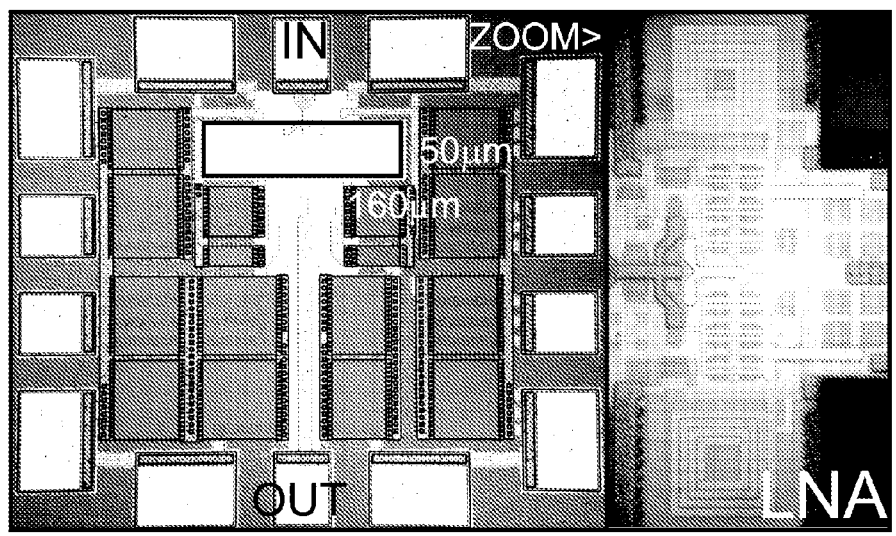
FIG. 14 shows a chip micrograph of a proposed dual-band LNA design according to the invention.

The circuit has been designed in a 0.13 µm CMOS process using a 1 V supply voltage. Only digital compatible options were used. The stacked inductors are designed in the lowest (digital) metal layers. For the lower frequency band (2.45 GHz) an inductor with 4.5 turns in four metal layers is selected, to obtain the desired inductance and resistive load. For the higher band (5.25 GHz), 3.5 turns and two metal layers are used. Both inductors occupy an area of only 40×40 µm². A sufficiently high value for $g_{mMn1}$ has been chosen for a reasonably low noise figure, yet maintaining a relatively low power consumption. The chip micrograph depicted in FIG. 14, shows the low area consumption (about twice the size of a bondpad) of the complete LNA. A zoom on the right side of FIG. 14, shows the stacked inductors, along with the LNA core and buffer.

Figure 15:
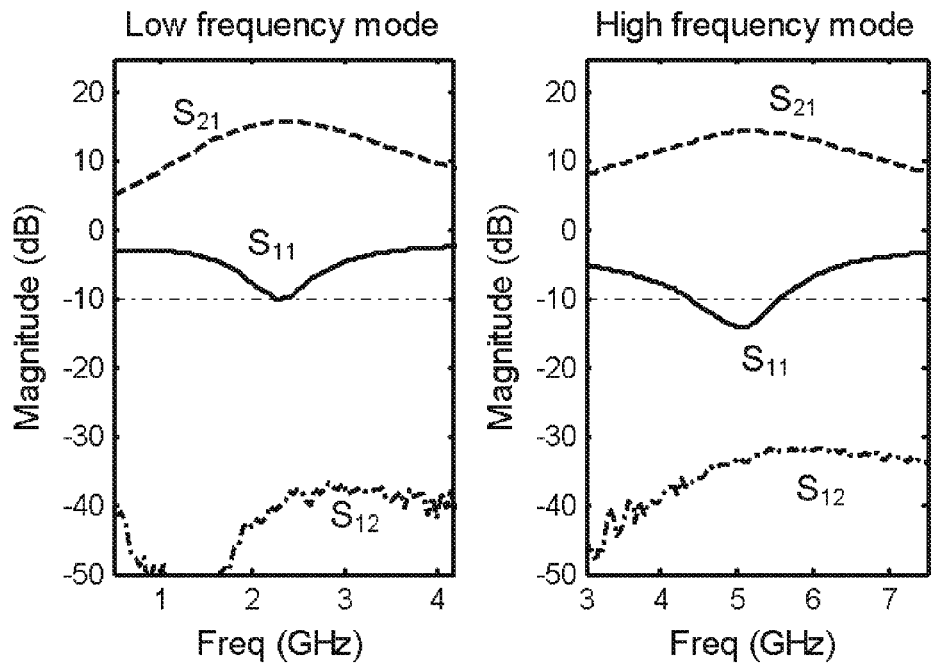
FIG. 15 shows a plot of the S-parameters of a proposed LNA according to the invention.
Figure 16:
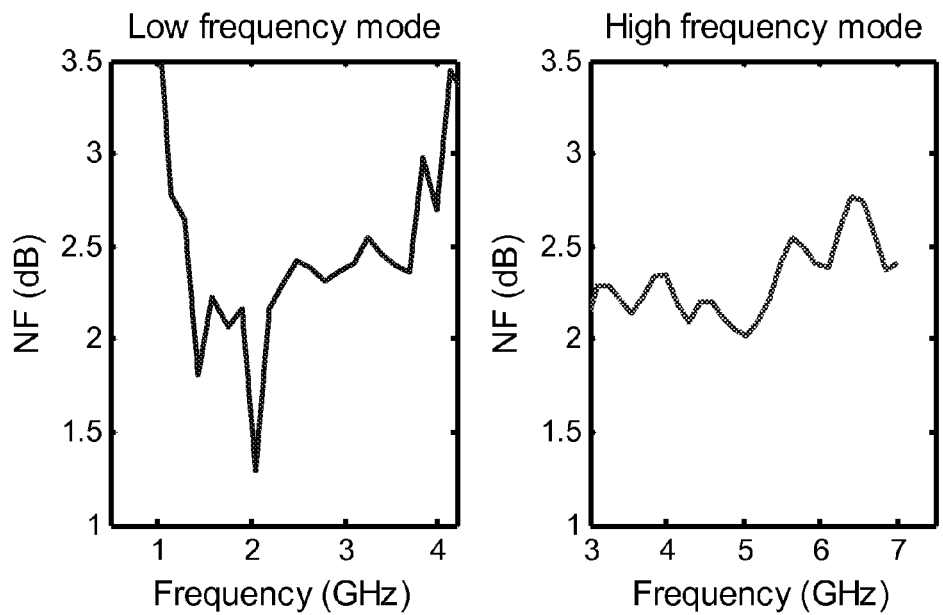
FIG. 16 shows a plot of the measured noise figure of a proposed LNA according to the invention.

FIG. 15 and FIG. 16 plot the measured S-parameters and NF. For 3.8 mW of power consumption, a voltage gain of 22 dB and 20.5 dB is achieved at 2.45 GHz and 5.25 GHz resp. for a minimum NF of 2.1 dB and a return loss below −10 dB. The power gain ($S_{21}$) is 16 dB and 14.5 dB, including the source follower buffer driving the 50Ω measurement setup, adding a loss of about 6 dB. In an actual system, the LNA would drive a mixer, and the buffer's losses would be limited. The buffer consumes an additional 1.8 mW. Due to a layout mistake, switches $SW_{3,i}$ are a short, resulting in an unnecessary DC loss current in the off-section. Simulations confirm however, that this bleeding DC current can be removed using $SW_{3,i}$, for no RF performance penalty.

Figure 17:
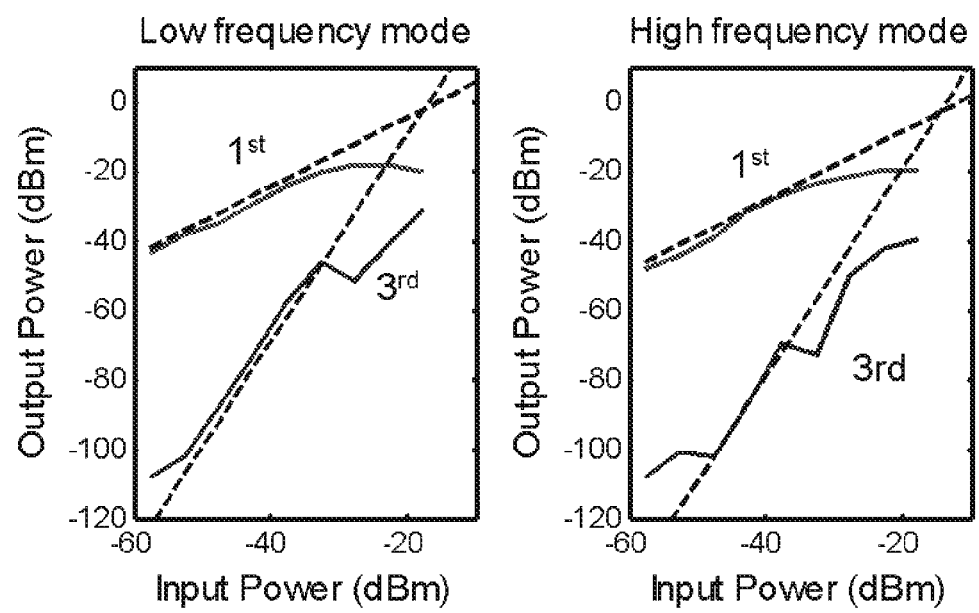
FIG. 17 shows plots of the output power of two-tone test measurements.

An in-band IIP3 of −17 dBm and −14.5 dBm at the low and high frequency mode respectively have been measured. FIG. 17 plots these two-tone measurement results for the 2.45 GHz (left side) and the 5.25 GHz (right side) band. If necessary, linearity can be improved as explained before.

Table II lists some recently published fully integrated dual-band LNA designs. Our design offers the best NF for a high gain and low power consumption. Its area is almost two orders of magnitude smaller than all other designs.

The invention claimed is:
1. A low noise amplifying circuit comprising:
   an input;
   a first output;
   a first feedback-and-amplifier circuit comprising:
      a first amplifying section comprising an input transistor and a first output transistor, wherein the first amplifying section is configured to operate in at least one first frequency band and to amplify signals between the input and the first output, and
      a first feedback circuit comprising a first feedback connection and configured to provide input matching from the first output to the input, wherein the first feedback circuit comprises a feedback transistor and at least one feedback resistor in series with the feedback transistor, and
   at least one first frequency-band-determining inductive section having a first predetermined resonance frequency and configured to substantially completely determine the at least one first frequency band, wherein:
      the at least one first frequency-band-determining inductive section is directly connected to the first output, and
      the at least one first frequency-band-determining inductive section is connected to the input via the first feedback connection.

2. The low noise amplifying circuit according to claim 1, wherein the at least one first frequency-band-determining inductive section comprises an inductor.

3. The low noise amplifying circuit according to claim 2, wherein the inductor is a stacked multilayer inductor.

4. The low noise amplifying circuit according to claim 1, wherein the at least one first frequency-band-determining inductive section comprises a plurality of frequency-band-determining inductive sections, wherein each frequency-band-determining inductive section in the plurality of fre-

TABLE II

RECENTLY PUBLISHED FULLY INTEGRATED DUAL BAND CMOS LNAs

| | This work | | RFIC 05 [Hyvonen] | | VLSI 01 [Hashemi] | | ASIC 03 [D. Feng] | | ICECS 03 [Jou] | | M&W comp letters 05 [Lu] | | EuMi 06 [Moreira] | |
|---|---|---|---|---|---|---|---|---|---|---|---|---|---|---|
| Technology | 0.13 µm CMOS | | 0.18 µm CMOS | | 0.35 µm CMOS | | 0.18 µm CMOS | | 0.25 µm CMOS | | 0.18 µm CMOS | | 0.25 µm BiCMOS | |
| $f_0$ (GHz) | 2.45 | 5.25 | 2.45 | 5.25 | 2.45 | 5.25 | 2.4 | 5 | 2.45 | 5.25 | 2.4 | 5.2 | 2.44 | 5.25 |
| $NF_{min}$ (dB) | 2.1 | 2.1 | 5 | 6 | 2.3 | 4.5 | 2.3 | 2.9 | 4.7 | 5.7 | 2.9 | 3.7 | 3 | 3.75 |
| Power (mW) | 3.8+ | | 2.5 | | 6 | | 14.2 | | 42.5 | | 11.7 | 5.7 | 9 | |
| Gain (dB) | 22* | 20.5* | 13.9* | 13.9* | 14 | 15.5 | 11.6 | 10.8 | 5.8 | 3.2 | 10.1 | 10.9 | 19.7 | 14.4 |
| $S_{11}$ (dB) | −10 | −15 | −14.4 | −12.4 | −25 | −15 | −5.1 | −26.3 | −20.5 | −12.8 | −10.1 | −11 | −9.4 | −9.1 |
| IIP3 | −17 | −14.5 | 2.8 | 2.8 | 0 | 5.6 | — | — | 7 | 17 | 4 | −5 | −13.4 | −7 |
| Approx. area (mm²) | 0.0065 | | — | | ~0.18** | | ~0.72 | | ~0.72 | | ~0.2 | | ~0.64 | |
| Concurrent (C)/ Switchable (S) | S | | C | | C | | C | | C | | S | | C | |

*voltage gain (other values are power gain),
**input inductor off-chip
+in off mode a DC bleeding current exists due to a layout mistake quency-band-determining inductive sections has a different resonance frequency and is configured to be switchably connected to the first output.

5. The low noise amplifying circuit according to claim 1, wherein the first amplifying section comprises a cascode amplifier.

6. The low noise amplifying circuit according to claim 1, further comprising:
   a second output;
   a second feedback-and-amplifier circuit comprising:
   a second amplifying section comprising the input transistor and a second output transistor, wherein the second amplifying section is configured to operate in at least one second frequency band and to amplify signals between the input and the second output, and
   a second feedback circuit configured to provide input matching from the second output to the input, and
   at least one second frequency-band-determining inductive section having a second predetermined resonance frequency and configured to substantially completely determine the at least one second frequency band, wherein the at least one second frequency-band-determining inductive section is directly connected to the second output,
   wherein the at least one of the first frequency-band-determining inductive section and the at least one second frequency-band-determining inductive section are configured to be switchably connected to the input transistor.

7. The low noise amplifying circuit according to claim 6, wherein at least one of the at least one first frequency-band-determining inductive section and the at least one second frequency-band-determining inductive section is controlled by one or more varactors providing a wide frequency tuning range.

8. A multimode receiver comprising a low noise amplifying circuit, the low noise amplifying circuit comprising:
   an input;
   a first output;
   a first feedback-and-amplifier circuit comprising:
      a first amplifying section comprising an input transistor and a first output transistor, wherein the first amplifying section is configured to operate in at least one first frequency band and to amplify signals between the input and the first output, and
      a first feedback circuit comprising a first feedback connection and configured to provide input matching from the first output to the input, wherein the first feedback circuit comprises a feedback transistor and at least one feedback resistor in series with the feedback transistor, and
   at least one first frequency-band-determining inductive section having a first predetermined resonance frequency and configured to substantially completely determine the at least one first frequency band, wherein:
      the at least one first frequency-band-determining inductive section is directly connected to the first output, and
      the at least one first frequency-band-determining inductive section is connected to the input via the first feedback connection.

9. The multimode receiver according to claim 8, wherein the at least one first frequency-band-determining inductive section comprises an inductor.

10. The multimode receiver according to claim 9, wherein the inductor is a stacked multilayer inductor.

11. The multimode receiver according to claim 8, wherein the at least one first frequency-band-determining inductive section comprises a plurality of frequency-band-determining inductive sections, wherein each frequency-band-determining inductive section in the plurality of frequency-band-determining inductive sections has a different resonance frequency and is configured to be switchably connected to the first output.

12. The multimode receiver according to claim 8, wherein the first amplifying section comprises a cascode amplifier.

13. The multimode receiver according to claim 8, further comprising:
   a second output;
   a second feedback-and-amplifier circuit comprising:
   a second amplifying section comprising the input transistor and a second output transistor, wherein the second amplifying section is configured to operate in at least one second frequency band and to amplify signals between the input and the second output, and
   a second feedback circuit configured to provide input matching from the second output to the input, and
   at least one second frequency-band-determining inductive section having a second predetermined resonance frequency and configured to substantially completely determine the at least one second frequency band, wherein the at least one second frequency-band-determining inductive section is directly connected to the second output,
   wherein the at least one first frequency-band-determining inductive section and the at least one second frequency-band-determining inductive section are configured to be switchably connected to the input transistor.

14. The multimode receiver according to claim 13, wherein at least one of the first frequency-band-determining inductive section and the at least one second frequency-band-determining inductive section is controlled by one or more varactors providing a wide frequency tuning range.

* * * * *